(12) United States Patent
Gijsman et al.

(10) Patent No.: US 12,433,039 B2
(45) Date of Patent: Sep. 30, 2025

(54) PHOTOVOLTAIC MODULE BACKSHEET COMPRISING POLYOLEFIN LAYERS

(71) Applicant: ENDURANCE SOLAR SOLUTIONS B.V., Geleen (NL)

(72) Inventors: Pieter Gijsman, Echt (NL); Robert Janssen, Echt (NL); Alessandro Gualdi, Echt (NL); Wei Huang, Echt (NL); Ruofei Zhao, Echt (NL)

(73) Assignee: ENDURANCE SOLAR SOLUTIONS INC., Nashua, NH (US)

( * ) Notice: Subject to any disclaimer, the term of this patent is extended or adjusted under 35 U.S.C. 154(b) by 189 days.

(21) Appl. No.: 17/778,491

(22) PCT Filed: Nov. 20, 2020

(86) PCT No.: PCT/EP2020/082879
§ 371 (c)(1),
(2) Date: May 20, 2022

(87) PCT Pub. No.: WO2021/099569
PCT Pub. Date: May 27, 2021

(65) Prior Publication Data
US 2022/0416104 A1    Dec. 29, 2022

(51) Int. Cl.
| | | |
|---|---|---|
| *H10F 19/85* | (2025.01) |
| *B32B 7/12* | (2006.01) |
| *B32B 27/08* | (2006.01) |
| *B32B 27/20* | (2006.01) |
| *B32B 27/30* | (2006.01) |
| *B32B 27/36* | (2006.01) |
| *B32B 37/15* | (2006.01) |
| *H10F 19/80* | (2025.01) |
| *H10F 71/00* | (2025.01) |

(52) U.S. Cl.
CPC .............. *H10F 19/85* (2025.01); *B32B 7/12* (2013.01); *B32B 27/08* (2013.01); *B32B 27/20* (2013.01); *B32B 27/308* (2013.01); *B32B 27/36* (2013.01); *B32B 37/153* (2013.01); *H10F 19/804* (2025.01); *H10F 71/00* (2025.01); *B32B 2250/02* (2013.01); *B32B 2250/24* (2013.01); *B32B 2260/046* (2013.01); *B32B 2264/1022* (2020.08); *B32B 2264/502* (2020.08); *B32B 2270/00* (2013.01); *B32B 2307/71* (2013.01); *B32B 2311/18* (2013.01); *B32B 2323/04* (2013.01); *B32B 2323/10* (2013.01); *B32B 2355/00* (2013.01); *B32B 2457/12* (2013.01)

(58) Field of Classification Search
CPC . H01L 31/0481; H01L 31/049; H01L 31/048; H01L 31/042; B32B 2250/03; B32B 2250/24; B32B 2250/242; B32B 27/308; B32B 27/32; H10F 19/85
See application file for complete search history.

(56) References Cited

U.S. PATENT DOCUMENTS

| | | | |
|---|---|---|---|
| 6,806,392 B2 | 10/2004 | Boesch et al. | |
| 2004/0024260 A1 | 2/2004 | Winkler et al. | |
| 2010/0108128 A1 | 5/2010 | Chu et al. | |
| 2014/0096825 A1* | 4/2014 | Bonekamp | B32B 27/08 156/182 |
| 2017/0226321 A1* | 8/2017 | Bonekamp | C08K 5/3432 |
| 2019/0181284 A1 | 6/2019 | Chen et al. | |

FOREIGN PATENT DOCUMENTS

| | | | |
|---|---|---|---|
| CA | 2688618 A1 * | 6/2010 | .......... C09J 123/142 |
| CN | 103958192 | 7/2014 | |
| CN | 106364103 | 2/2017 | |
| CN | 107841029 | 3/2018 | |
| CN | 109964320 | 2/2019 | |
| EP | 2277693 | 1/2011 | |
| EP | 2599626 A1 * | 6/2013 | ............. B32B 27/08 |
| EP | 2617568 | 7/2013 | |
| EP | 2765616 | 8/2014 | |
| JP | 2012213937 A * | 11/2012 | |
| JP | 2015-134502 | 7/2015 | |
| WO | 2012/024262 | 2/2012 | |
| WO | 2013/003543 | 1/2013 | |
| WO | 2013/135349 | 9/2013 | |
| WO | 2015/103872 | 7/2015 | |
| WO | 2015/199925 | 12/2015 | |
| WO | 2018/087366 | 5/2018 | |
| WO | 2019/185842 | 10/2019 | |

OTHER PUBLICATIONS

English machine translation of Kanai et al. (JP 2012/213937) published Nov. 8, 2012.*

(Continued)

*Primary Examiner* — Christina Chern
(74) *Attorney, Agent, or Firm* — Nixon & Vanderhye, P.C.

(57) ABSTRACT

The present invention relates to a photovoltaic module backsheet, comprising photovoltaic module backsheet comprising, in order: a functional layer; a connecting layer; and a weather-resistant layer, wherein each layer of the backsheet comprises at least 50 wt. % polyolefin and the backsheet is free of fluorinated polymers, characterized in that: i) the functional layer comprises a blend of polyethylene and a polyethylene copolymer; and ii) the weather-resistant layer comprises polypropylene; a UV stabilizer; a primary antioxidant, which primary antioxidant is a phenolic antioxidant or an aromatic amine antioxidant; and secondary antioxidant, which secondary antioxidant is a trivalent phosphorus containing antioxidant or a thioether containing antioxidant. The present invention also relates to a process for producing the backsheet and a photovoltaic module comprising the backsheet according to the present invention.

18 Claims, No Drawings

(56) References Cited

OTHER PUBLICATIONS

International Search report for PCT/EP2020/082879 dated Feb. 10, 2021 (4 pages).
Written Opinion of the ISA for PCT/EP2020/082879 dated Feb. 10, 2021 (6 pages).

* cited by examiner

PHOTOVOLTAIC MODULE BACKSHEET COMPRISING POLYOLEFIN LAYERS

This application is the U.S. national phase of International Application No. PCT/EP2020/082879 filed Nov. 20, 2020 which designated the U.S. and claims priority to WO PCT/CN2019/120226 filed Nov. 22, 2019, the entire contents of each of which are hereby incorporated by reference.

The present invention relates to a backsheet for photovoltaic modules. The present invention in particular relates to a backsheet, wherein each layer comprises at least 50 wt. % polyolefin and the backsheet is free of fluorinated polymers. The present invention further relates to a method of making such a backsheet and to photovoltaic modules comprising such a backsheet.

Photovoltaic modules are an important source of renewable energy. They comprise photovoltaic cells that release electrons when exposed to sunlight, thereby generating electricity. Photovoltaic cells, which are usually semiconductor materials, may be fragile and are typically encapsulated in polymeric materials that protect them from physical shocks and scratches. The encapsulated photovoltaic cells are generally further protected on each side by a protective layer that is both electrically insulating and resistant to weathering, abrasion or other physical insults, for the lifetime of the photovoltaic module.

A photovoltaic module has a front surface protection sheet disposed on the side on which sunlight is incident, to protect the surface. This layer is for example a glass layer, which is a rigid outer layer that protects the photovoltaic cells and electronics from the environment while allowing light to pass through and be converted into electricity. The photovoltaic module also has a solar cell rear surface protection sheet called a backsheet, disposed on the opposite side to protect power generation cells.

The backsheet is typically a multi-layered polymer sheet that protects the PV module from UV, moisture and weather while acting as an electrical insulator. The backsheet must provide protection from environmental conditions for in excess of 20 years. It must therefore be physically and chemically stable over such a time-period. The backsheet often comprises several polymeric layers to provide the above-mentioned properties and to minimize deterioration in the long-term performance of solar cell modules. The several polymeric layers have their own function in the backsheet. Normally a backsheet comprises a functional layer facing the cells, a structural reinforcement layer, a weather-resistant layer and adhesive layers between the functional layer and structural reinforcement layer and/or between structural reinforcement layer and weather-resistant layer. Examples of polymers used in the above-mentioned layers are polypropylene, polyvinylchloride, polyesters such as PET or PBT, fluoro-resins such as PTFE or PVDF and acrylic resins.

Recent developments in photovoltaic backsheets include the use of co-extrusion to produce a multi-layer backsheet. This has the advantage of increasing interlaminar strength and thereby reducing the chance of delamination of the backsheet. Coextrusion requires the polymers in the multiple layers to be sufficiently compatible in terms of bonding and to be processable in coextrusion apparatus.

Another recent development in photovoltaic backsheets is the avoidance of fluorinated polymers. Fluorinated polymers, for example PVF and PVDF are commonly used in photovoltaic backsheets because they have good barrier properties, protecting the module components against environmental conditions. However, it is not possible to recycle fluorinated polymers, meaning that at the end of the lifetime of the photovoltaic module, the fluorinated polymer is a waste product. Moreover, the fluorinated polymer may decompose or be combusted releasing potentially harmful fluorinated compounds into the environment.

Fluorine-free, coextruded backsheets are described in the prior art. Polyamide provides a good barrier against weathering, especially damage by UV radiation. WO2015103872A1 describes a solar module backsheet comprising a weather-resistant layer comprising biaxially oriented polyamide or polyamide stabilized with a heat stabilizer and a UV stabilizer and comprising an inorganic material. WO2018/087366A1 describes a solar module backsheet comprising a polyamide weather-resistant layer. WO2013/135349A1 describes a coextruded solar module backsheet comprising polyamide layers and thermoplastic polyolefin layers, for example flexible polypropylene layers. The polyamide layer is present to improve mechanical integrity, provide an oxygen and $CO_2$ barrier and protect the thermoplastic polyolefin layer from corrosive degradation products. US20190181284 describes a three-layer solar module backsheet, wherein the (outer) weather-resistant layer comprises a polymer network plastic alloy obtained from cross-linking and is preferably polyamide 12. EP2617568A1 describes a photovoltaic module backsheet comprising three layers of comprised principally of polyolefin. In use, solar modules may experience two sources of particularly high temperature. First, operation in high temperature environments such as deserts can lead to high daily maximum temperatures, which are repeated for the more than 20-year lifetime of the module. Second, formation of localized areas of elevated temperature, known as hotspots, may occur. Hotspots are the result of a localized decrease in efficiency due to shading, soiling, cell damage or cell mismatch causing lower power output and an acceleration of the materials degradation in the affected area. Both forms of high temperature can lead to discoloring, e.g. yellowing of a white backsheet, and thermal degradation, including distortion and cracking, of materials in the backsheet. Backsheets of the prior art are known to suffer from both these effects.

The object of the present invention is to overcome the above-mentioned disadvantages.

The present inventors have surprisingly found that a photovoltaic module which avoids the use of both fluorinated polymers and polyamide-based layers can be produced having good electrical insulation and weather-resistance, including good UV-stability, high-temperature stability and water barrier properties. In particular, the backsheet of the present invention is more resistant to cracking or yellowing during exposure to high temperatures, for example from hot spots or high temperature long term environment. More specifically a photovoltaic module backsheet comprising layers, which each comprise a majority of polyolefin can be produced.

Accordingly, the present invention provides a photovoltaic module backsheet comprising, in order: a functional layer; a connecting layer; and a weather-resistant layer, wherein each layer of the backsheet comprises at least 50 wt. % polyolefin and the backsheet is free of fluorinated polymers, characterized in that:
  the functional layer comprises a blend of polyethylene and a polyethylene copolymer; and
  the weather-resistant layer comprises polypropylene; a UV stabilizer; a primary antioxidant, which primary antioxidant is a phenolic antioxidant or an aromatic amine antioxidant; and secondary antioxidant, which secondary antioxidant is a trivalent phosphorus containing antioxidant or a thioether containing antioxidant.

Further, the present invention provides a process for producing a photovoltaic module backsheet as defined in any one of claims 1 to 14 comprising:

i) feeding a functional layer composition; a connecting layer composition; and a weather-resistant layer composition independently to a multi-layer film coextrusion apparatus; and ii) melting and coextruding the compositions, in the multi-layer film coextrusion apparatus, into a photovoltaic module backsheet in the order: functional layer, connecting layer, weather-resistant layer.

As used herein, the term polyolefin includes copolymers of an olefin, wherein at least 50% of the monomers are olefinic. For example, the term polyethylene includes copolymers of ethylene, wherein at least 50% of the monomers are polyethylene; and the term polypropylene includes copolymers of propylene, wherein at least 50% of the monomers are polypropylene.

As used herein, wt. % refers to percentage by weight of the specified polymer based on the weight of the layer in which the polymer is present.

The polypropylene used in any of the layers of the present invention may be homopolypropylene, copolypropylene, block copolypropylene or a blend thereof. Suitable comonomers include α-polyolefins, for example 1-butene, 1-hexene, 1-octene and combinations thereof. A polypropylene copolymer preferably comprises at least 75% monomer units derived from propene; more preferably at least 85%; yet more preferably 95%. The polypropylene may be linear or branched.

The polyethylene used in any of the layers of the present invention may be homopolyethylene, copolyethylene, block copolyethylene or a blend thereof. Suitable comonomers include α-polyolefins, for example 1-butene, 1-hexene, 1-octene and combinations thereof. A polyethylene copolymer preferably comprises at least 75% monomer units derived from ethene; more preferably at least 85%; yet more preferably 95%. The polyethylene may be linear or branched.

The photovoltaic backsheet of the present invention may comprise layers other than a functional layer, connecting layer and weather-resistant layer. However, the typically, the photovoltaic backsheet consists of a functional layer; a connecting layer; and a weather-resistant layer.

The weather-resistant layer is located at one face of the backsheet. In use in a photovoltaic module, this layer is exposed to the air, with the opposite face being adjacent an encapsulant for photovoltaic cells and directed toward the photovoltaic cells.

The weather-resistant layer of the present invention comprises at least 50 wt. % polyolefin. The weather-resistant layer comprises polypropylene.

The weather-resistant layer may comprise a blend of polypropylene and an alternative polymer. The alternative polymer may be a polyethylene, a polyamide or a polyester. Preferably, the alternative polymer is a polyethylene.

Typically, the weather-resistant layer comprises at least 50 wt. % of polypropylene. Preferably, the weather-resistant layer comprises at least 60 wt. % of polypropylene, more preferably at least 70 wt. %, even more preferably at least 80 wt. % polypropylene or even at least 90 wt. % polypropylene. The weather-resistant layer comprises at most 98 wt. % polypropylene. Preferably, the weather-resistant layer comprises at most 95 wt. % polypropylene; more preferably at least 92 wt. % polypropylene, or even 90 wt. % polypropylene.

Preferably, the weather-resistant layer comprises a polypropylene-polyethylene copolymer. More preferably, the weather-resistant layer comprises from 75 to 90 wt. % polypropylene-polyethylene copolymer.

The weather-resistant layer may comprise an inner sub-layer and an outer sub-layer. The outer layer may be more resistant to external conditions, for example UV radiation and moisture. Typically, the composition of the inner sub-layer and outer sub-layer are similar. For example, the polymer composition of the inner sub-layer and outer sub-layer are typically identical. Typically the inner sub-layer and outer sub-layer differ only in the type and/or quantity of additive present in the layer. For example, the amount of inorganic filler or titanium dioxide in the two sub-layers may be different. Preferably, the weather-resistant layer comprises an outer sub-layer comprising an inorganic filler and an inner sub-layer comprising an inorganic filler, wherein the outer sub-layer comprises a lower wt. % of inorganic filler than the inner sub-layer. Preferably, the outer sub-layer and inner sub-layer each comprise titanium dioxide, and the outer sub-layer comprises a higher wt. % titanium dioxide than the inner sub-layer.

The weather-resistant layer comprises a UV stabilizer. A typical UV stabilizer is a hindered amine light stabilizer.

The weather-resistant layer comprises a primary antioxidant which primary antioxidant is a phenolic antioxidant or an aromatic amine antioxidant. The primary antioxidant is a radical scavenger. Typically, it is a phenolic antioxidant.

Examples of phenolic antioxidants are: benzenepropanoic acid, 3,5-bis(1,1-dimethylethyl)-4-hydroxy-octadecyl ester; 2-Propyleneacid, 2-isopentane 6[(3-isopentane-2-hydroxy-5-isopentane-phenyl)-ethyl]-4-isopentanephenylester; 2-propenoic acid, 2-(1,1-dimethylethyl)-6-[[3-1,1-dimethylethyl)-2-hydroxy-5-methylphenyl]methyl]-4-methylphenylester; di-ethyl-ester of 3,5-di-t-butyl-4-hydroxy-benzyl-phosphoric acid; 2,5,7,8-Tetra-methyl-2-(4',8',12'-trimethyl-tri-decyl)-chroman-6-01; benzenepropanoic acid, 3,5-bis(1,1-dimethylethyl)-4-hydroxy-, isooctyl ester; benzenepropionic acid, 3,5-bis (1,1-dimethylethyl)-4-hydroxy, isotridecyl ester; benzenepropanoic acid, 3,5-bis(1,1-dimethylethyl)-4-hydroxy-C1345 branched and linear alkyl esters; 2,2'-Methylenebis (6-t-butyl-4-methylphenol); 2,2'-Methylenebis (4-ethyl-6-t-butylphenol); 2,2'-Methylenebis 6-(1-methylcyclohexyl)-p-cresol; 4,4'-Butylidenebis (6-t-butyl-3-methyl-phenol); 2,2'-ethylidenebis (4,6-di-t-butylphenol) Phenol; 4,4'-methylenebis[2,6-bis(1,1-dimethylethyl)-2,2'-isobutylidenebis (4,6-dimethylphenol); N,N'-Hexamethylene bis (3,5-di-t-butyl-4-hydroxyhydrocinnamamide); 3,9-Bis(1,1-dimethyl-2-(B-(3-t-butyl-4-hydroxy-5-methyl-phenyl)-propyonyl-oxy)-ethyl)-2,4,8,10-tetraoxospiro; ethylenebis (oxyethylene) bis (3-t-butyl-4-hydroxy-5-methylhydrocinnamate) Hexamethylenebis (3,5-di-t-butyl-4-hydroxycinnamate); benzenepropanamide, N,N'-1,3-propanediylbis[3,5-bis(1,1-dimethylethyl)-4-hydroxy-] Calcium bis[monoethyl(3,5-di-t-butyl-4-hydroxybenzyl)phosphonate]; phenol, 2,2'-methylenebis[4-methyl-6-nonyl-] 1,1,3-Tris(2-methyl-4-hydroxy-5-t-butyl phenyl) butane; phenol, 4,4'4'''-[(2,4,6-trimethyl-1,3,5-benzenetriryl)-tris-(methylene)]-tris-2,6-bis(1,1-dimethylethyl)-Bis-[3,3-bis-(4'-hydroxy-3'-t-butylphenyl butanoic acid]-glycol ester Tris(3,5-di-t-butyl-4-hydroxy benzyl) isocyanurate; 1,3,5-Tris (4-t-butyl-3-hydroxy-2,6-dimethylbenzyl)-1,3,5-triazine-2,4,6-(1H,3H,5H)-trione; 3-(3,5-di-t-butyl-4-hydroxy-phenyl) propion acid ester with 1,3,5-tris (2-hydroxyethyl)-iso-cyanurate; tetrakis [methylene (3,5-di-t-butyl-4-hydroxyhydrocinnamate)] methane p-Cresol/dicyclopentadiene butylated reaction product; 1,1,3-tris[2-methyl-4-[3-(3,5-di-tert-butyl-4-hydroxyphenyl)propionyloxy]-5-tert-butylphenyl]butane.

Examples of aromatic amines are: 4,4'-Di-cumyl-di-phenyl-amine; N,N'-Diphenyl-p-phenylenediamine; 2,2,4-Trimethyl-1,2-dihydroquinoline polymer 4,4'-Dioctyl-diphenyl-amine; 1,4-Benzenediamine, N,N'-bis(1-methylpropyl); N-Isopropyl-N'-phenyl-paraphenylenediamine; N-1,3-dimethyl-butyl-N'-phenyl-paraphenylene-diamine; N,N'-Bis (1,4-dimethylpentyl)-p-phenylenediamine 2-Naphthalenamine; N-phenyl-4-Benzenediamine; N-(1-methylethyl)-N'-phenyl-benzenamine; N-phenyl-,reaction product with 2,4,4 trimethyl pentane; 1,4-Benzenediamine; N,N'-bis[4-(1-phenylethyl)phenyl]-p-(p-Toluene-sulfonylamido)-diphenylamine; benzeneamine; N-{4-[(1,3-dimethylbutyl)imino]-2,5-cyclohexadien-1-ylidine; N-phenyl-N'-1-phenylethyl-1,4-phenylenediamine; reaction product of diphenyl amine and acetone.

Preferably the primary antioxidant is a phenolic antioxidant and is selected from benzenepropanoic acid, 3,5-bis(1,1-dimethylethyl)-4-hydroxy-octadecyl ester; 2,5,7,8-Tetramethyl-2-(4',8',12'-tri-methyl-tri-decyl)-chroman-6-ol; N,N'-Hexamethylene bis (3,5-di-t-butyl-4-hydroxyhydrocinnamamide); ethylenebis (oxyethylene) bis (3-t-butyl-4-hydroxy-5-methylhydrocinnamate); hexamethylenebis (3,5-di-t-butyl-4-hydroxycinnamate); phenol, 4,4'4'''-[(2,4,6-trimethyl-1,3,5-benzenetriyl)-tris-(methylene)]-tris-2,6-bis (1,1-dimethylethyl)-; bis-[3,3-bis-(4'-hydroxy-3'-t-butylphenyl butanoic acid]-glycol ester; tris(3,5-di-t-butyl-4-hydroxy benzyl) isocyanurate; 3,9-bis(2-(3-(3-tert-butyl-4-hydroxy-5-methylphenyl)propionyloxy-1,1-dimethylethyl)-2,4,8,10-tetraoxaspiro[5.5]undecane; 1,3,5-Tris (4-t-butyl-3-hydroxy-2,6-dimethylbenzyl)-1,3,5-triazine-2,4,6-(1H,3H,5H)-trione; and tetrakis [methylene (3,5-di-t-butyl-4-hydroxyhydrocinnamate)] methane 3-(3,5-di-t-butyl-4-hydroxy-phenyl) propion acid ester with 1,3,5-tris (2-hydroxy-ethyl)-iso-cyanurate.

The weather-resistant layer comprises a secondary antioxidant, which secondary antioxidant is a trivalent phosphorus containing antioxidant or a thioether containing antioxidant. The secondary antioxidant is a hydroperoxide decomposer. Typically, it is a thioether containing antioxidant.

Examples of trivalent phosphorus containing antioxidants are: Trisnonylphenyl phosphite; trilauryl phosphite; tris (2.4-di-t-butylphenyl) phosphite; di-isooctylphosphite; triisodecyl phosphite; diisodecylphenylphosphite; diphenyl isodecyl phosphite; triphenyl phosphite; tris(tridecyl) phosphite; diphenyl isooctyl phosphite; 12H-dibenzo[d.g] [1.3.2]dioxaphosphocin. 2.4.8.10-tetrakis(1.1-dimethyl-ethyl)-6-(octyloxy)-; 2.2'-Ethylidenebis (4,6-di-t-butylphenyl) fluorophosphonite; di-sodium-hydrogen-phosphite; phosphorous acid, bis[2.4-bis(1.1-dimethylethyl)-6-methylphenyl]ethyl ester; 2.4.6 Tri-t-butylphenyl-2-butyl-2-ethyl-1,3-propane-diol-phosphite; triisooctyl phosphite; tris (dipropyleneglycol) phosphite; diisooctyl octylphenyl phosphite; tris-(2.4-di-tert.butyl-5-methylphenyl)-phosphite (phenylethyl)phenylphosphites; diphenylphosphite; phenylneopentyleneglycolphosphite Phosphorous acid, trioctadecyl ester; phosphorous acid, dinonylphenyl bis(nonylphenyl) ester; phosphorous acid, 2-ethylhexyl diphenyl ester; 9,1 O-Dihydro-9-oxa-1 O-phosphaphenanthren-1 O-oxide; diphenyl tridecyl phosphite; phosphonic acid, dioctyl ester; phosphorous acid, 2-ethylhexyl diphenyl ester; bis(octadecyloxy)-2,4,8,10-tetraoxa-3,9-diphosphaspiro[5.5]undecane; tetrakis-(2,4-di-tert-butyl-phenyl)-4,4'-bi-phenylene-di-phosphonite; bis (2,4-di-t-butylphenyl) pentaerythritol diphosphite Bis-(2,6-di-tbutyl-4-methyl-phenyl)-pentaerythritol-di-phosphite; 2,4,8,10-Tetraoxa-3,9-diphosphaspiro[5.5]undecane,3,9-bis[2,4,6-tris(1,1-dimethylethyl) phenoxy]-; poly 4,4' isopropylidenediphenol C1245 Alcohol phosphite; tetrakis isodecyl 4,4'-isopropylidene diphosphate; bis-(2,4-dicumylphenyl)-pentaerytritol-diphosphite; phosphorous acid, (1-methylethylidene)di-4,1-phenylenetetraoctadecyl ester; phosphorous acid, oxybis (methyl-2,1 ethane diyl) tetraphenyl ester; diisodecyl pentaerythritol diphosphite 2,4,8,10-Tetraoxa-3,9-diphosphaspiro[5.5]undecane, 3,9-bis[2-(1,1-dimethylethyl)-4-(1-methyl-1-phenylethyl)phenoxy]-Tetra(tridecyl)-4,4'-butylidene-bis(6-t-butyl-2-methyldiphenol)diphosphate; phosphonous acid, [1,1'-biphenyl]-3,3'-diylbis-, tetrakis[2,4-bis(1,1-dimethylethyl)-5-methylphenyl] ester; poly(dipropyleneglycol)phenylphosphite; 2,4,8,10-Tetraoxa-3,9-diphosphaspiro[5.5]undecane,3,9-bis(nonylphenoxy)-2-[[2,4,8,10-Tetrakis(1,1-dimethylethyl)dibenzo[d,f][1,3,2]dioxaphosphepin-6-yl] oxy]-N,N-bis[2[[2,4,8,10-tetrakis(1,1-dimethylethyl) dibenzo[d,f][1,3,2]dioxaphosphepin-6-yl]oxy-ethyl] ethanamine 3,6,8,11,14,16,19,22,24,27-Decaoxa-7,15,23-triphosphanonacosane-1,29-diol; phosphorous acid, P,P',P''-[(1-methyl-1-propanyl-3-ylidene)tris[2-(1,1-dimethylethyl)-5-methyl-4,1-phenylene]]; P,P,P',P',P''',P''-hexatridecyl ester; and trilauryl trithiophosphite.

Examples of thioether containing antioxidants are: dilauryl thiodipropionate; dimyristyl thiodipropionate; distearyl thiodipropionate; ditridecyl thiodipropionate; 3,3-thiodipropionic acid; lauryl-stearylthiodipriponate; disulfide, dioctadecyl; cyclohexane, 1-(octadecylthio)-3-[2-(octadecylthio) ethyl]-Propanoic acid, 3-(dodecylthio)-[,] 1,1'-[oxybis (2,1-ethanediyloxy-2,1-ethanediyl)] ester; pentaerythrityl tetrakis β-laurylthiopropionate); bis[2-methyl-4-{3-n-alkyl (C12 or C14) thiopropionyloxy)-5-t-butylphenyl] sulphide; and 3,3'-thiobis-propanoic acid.

Preferably, the secondary antioxidant is a thioether antioxidant, and is selected from dilauryl thiodipropionate; distearyl thiodipropionate; pentaerythrityl tetrakis (β-laurylthiopropionate); and 3,3'-thiobis-propanoic acid.

Both the primary antioxidant and the secondary antioxidant reduce oxidative degradation. Typically, the ratio of wt. % primary antioxidant stabilizer to wt. % secondary antioxidant is from 0.05 to 2.0. Preferably, the ratio of wt. % primary antioxidant stabilizer to wt. % secondary antioxidant is from 0.1 to 1.0; more preferably from 0.3 to 0.6. A synergistic effect on high temperature stability of this ratio of antioxidants may be seen.

Typically, the primary antioxidant is present in an amount of from 0.1 to 3 wt. % Preferably, it is present in an amount of from 0.2 to 2 wt. %, for example 0.25 wt. % or 0.5 wt. %.

Typically, the primary antioxidant is present in an amount of from 0.1 to 5 wt. % Preferably, it is present in an amount of from 0.2 to 4 wt. %, for example 0.75 wt. %, 1.0 wt. %, 1.5 wt. %, 2.0 wt. % or 3.0 wt. %.

The weather-resistant layer may comprise one or more additives in addition to the UV-stabilizer, primary antioxidant and secondary antioxidant. Example of the additives include UV absorbers, thermal stabilizers and/or hydrolysis stabilizers. When such additives are used, the weather-resistant layer comprises from 0.05 to 10 wt. % more preferably to 5 wt. % additives.

The weather-resistant layer according to the present invention may further comprise an inorganic filler. Examples of these inorganic fillers are calcium carbonate, titanium dioxide, barium sulfate, mica, talc, kaolin, ZnO, ZnS, glass microbeads and glass fibers. When such fillers are used, the weather-resistant layer comprises from 0.05 to 20 wt. % of filler based on the total weight of the polymers in the functional layer, preferably the functional layer comprises from 5 to 15 wt. % of filler.

White pigments such as TiO2, ZnO or ZnS may be added to the functional layer to increase backscattering of sunlight leading to increased efficiency of the solar module. Black pigments such as carbon black may also be added for esthetic reasons.

The weather-resistant layer typically has a thickness of from 100 to 400 μm. Preferably, the weather-resistant layer has a thickness of from 150 to 300 μm; more preferably from 200 to 250 μm.

The functional layer is located at one face of the backsheet. In use in a photovoltaic module, this layer is adjacent an encapsulant for photovoltaic cells and directed toward the photovoltaic cells. One function of the functional layer of the backsheet is adhesion to the encapsulant. Another function is to reflect light onto the photovoltaic cells.

The functional layer of the present invention comprises at least 50 wt. % polyolefin. The functional layer comprises a blend of polyethylene and a polyethylene copolymer.

Typically, the functional layer comprises at least 50 wt. % of polyethylene. Preferably, the functional layer comprises at least 60 wt. % of polyethylene, more preferably at least 70 wt. %, even more preferably at least 80 wt. % polyethylene or even at least 90 wt. % polyethylene. The weather-resistant layer comprises at most 98 wt. % polyethylene. Preferably, the weather-resistant layer comprises at most 95 wt. % polyethylene; more preferably at least 92 wt. % polyethylene, or even 90 wt. % polyethylene.

Typically, the functional layer comprises from 1 to 30 wt. % of polypropylene. Preferably, it comprises from 5 to 15 wt. % polypropylene. Polypropylene serves to increase the temperature resistance of the functional layer, thus reducing delamination or thermal shrinkage under high operational temperature.

Preferably, the functional layer comprises a ternary blend of polypropylene, polyethylene and a polyethylene copolymer. Preferably, the polyethylene is linear low-density polyethylene.

Typically, the polyethylene copolymer ethylene acrylate copolymer, preferably ethylene methacrylate copolymer, for example Elvaloy AC 1820 from DuPont. Typically, the functional layer further comprises a vinyl acetate copolymer.

Typically, the ethylene methacrylate polymer is present in an amount of from 1 to 40 wt. %; preferably from 20 to 30 wt. %. Ethylene methacrylate copolymer serves to increase adhesion between the functional layer and the EVA encapsulant.

Typically, the functional layer comprises a UV stabilizer, primary antioxidant, secondary antioxidant, UV absorber, thermal stabilizer and/or hydrolysis stabilizer, inorganic filler or pigment as defined above with respect to the weather-resistant layer.

The functional layer typically has a thickness of from 10 to 50 μm. Preferably, the functional layer has a thickness of from 20 to 40 μm; more preferably from 25 to 30 μm. The functional layer typically has a thickness of less than 20% of the thickness of the photovoltaic module backsheet. Preferably, the functional layer has a thickness of less than 15% of the thickness of the photovoltaic module backsheet. More preferably, the functional layer has a thickness of less than 10%, or even less than 5%, of the photovoltaic backsheet. The photovoltaic module backsheet typically has a thickness of from 150 to 500 μm. Preferably, the photovoltaic module backsheet has a thickness of from 200 to 400 μm; more preferably from 250 to 350 μm, for example about 300 μm.

The photovoltaic backsheet according to the present invention comprises a connecting layer. The connecting layer comprises at least 50 wt. % polyolefin. The connecting layer is located between the functional layer and the weather-resistant layer.

The connecting layer connects the functional layer to the weather-resistant layer. The connecting layer typically comprises polyethylene. The connecting layer more preferably comprises a polyethylene copolymer.

Typically, the connecting layer comprises at least 50 wt. % of polyethylene. Preferably, the connecting layer comprises at least 60 wt. % of polyethylene, more preferably at least 70 wt. %, even more preferably at least 80 wt. % polyethylene or even at least 90 wt. % polyethylene. The connecting layer comprises at most 98 wt. % polyethylene. Preferably, the connecting layer comprises at most 95 wt. % polyethylene; more preferably at least 92 wt. % polyethylene, or even 90 wt. % polyethylene.

The connecting layer may comprise, for example, a maleic anhydride grafted polyolefin such as maleic anhydride grafted polyethylene or maleic anhydride grafted polypropylene, an ethylene-acrylic acid copolymer an ethylene acrylic acid terpolymer or an ethylene-acrylic ester-maleic anhydride terpolymer. The connecting layer further preferably comprises ethylene/butyl acrylate/maleic anhydride grafted polypropylene.

The connecting layer preferably comprises a polyethylene-polypropylene block copolymer. More preferably, it comprises a polyethylene-polypropylene block copolymer with polyolefin blend. Preferably, the polypropylene is not grafted.

The connecting layer may comprise a modifier. For example the connecting layer may comprise a polyolefin elastomer. The connecting layer typically comprises up to 30 wt % polyolefin elastomer. Preferably, the connecting layer comprises from 10 to 20 wt % polyolefin elastomer. More preferably, the connecting layer comprises about 25 wt. % polyolefin elastomer.

Typically, the connecting layer comprises a UV stabilizer, primary antioxidant, secondary antioxidant, UV absorber, thermal stabilizer and/or hydrolysis stabilizer, inorganic filler or pigment as defined above with respect to the weather-resistant layer.

The connecting layer typically has a thickness of from 10 to 50 μm. Preferably, the connecting layer has a thickness of from 20 to 40 μm; more preferably from 25 to 30 μm.

Suitable polymer materials for photovoltaic cell encapsulants typically possess a combination of characteristics such as high impact resistance, high penetration resistance, good ultraviolet (UV) light resistance, good long term thermal stability, adequate adhesion strength to glass and/or other rigid polymeric sheets, high moisture resistance, and good long term weatherability. Examples of encapsulants are ionomers, ethylene vinyl acetate (EVA), poly(vinyl acetal), polyvinylbutyral (PVB), thermoplastic polyurethane (TPU), polyvinylchloride (PVC), metallocene-catalyzed linear low density polyethylenes, polyolefin block elastomers, poly (ethylene-co-methyl acrylate) and poly(ethylene-co-butyl acrylate), silicone elastomers or epoxy resins. EVA is the most commonly used encapsulant material. EVA sheets are usually inserted between the solar cells and the top surface (called front encapsulant) and between the solar cells and the rear surface (called a back encapsulant).

The present invention provides a photovoltaic module comprising the photovoltaic module backsheet as defined herein. A photovoltaic module comprises at least the following layers in order of position from the front sun-facing side to the back non-sun-facing side: (1) a transparent pane (representing the front sheet), (2) a front encapsulant, (3) a solar cell layer, (4) a back encapsulant and (5) the backsheet according to the present invention.

The front sheet is typically either a glass plate or in case of flexible modules, a polymeric sheet having high transmission of light.

The present invention further relates to a process for preparing a photovoltaic module backsheet. A preferred process comprises:

i) feeding a functional layer composition; a connecting layer composition; an inner weather-resistant layer composition and an outer weather-resistant layer composition independently to a multi-layer film coextrusion apparatus; and ii) melting and coextruding the compositions, in the multi-layer film coextrusion apparatus, into a photovoltaic module backsheet in the order: functional layer, connecting layer, inner weather-resistant layer and outer weather-resistant layer.

The invention is now demonstrated by means of a series of examples and comparative experiments.

EXAMPLES

Method for Manufacturing a Photovoltaic Backsheet Comprises the Following Steps:

Material of a weathering-resistant layer, an adhesive layer, a structure reinforcing layer and a functional layer are respectively pelletized by an extruder to obtain plastic pellets of respective layers.

A back sheet is prepared by a multilayer co-extrusion process whereby the pellets of the respective layers are added to multiple extruders, melt-extruded at a high temperature, flow through an adapter and a die, cooled by a cooling roller and shaped to manufacture the multi-layer back sheet. Composition of the different layers in the multilayer backsheets are given in Table 1.

Measurements

Damp heat ageing was carried out at 85° C. and 85% relative humidity for a period of 200 hours. Elongation of a sample was measured after damp heat ageing and compared to a sample which was not subjected to damp heat ageing. The elongation retention % was calculated. Calculations were made both for the machine direction and for the transverse direction.

Thermal stability was determined by heating samples to 200° C. for 5 hours. Appearance of the sample after heating is described.

Thermal ageing was carried out at 150° C. for a period of 300 hours. Elongation of a sample was measured after thermal ageing and compared to a sample which was not subjected to thermal ageing. The elongation retention % was calculated. Calculations were made both for the machine direction and for the transverse direction.

Results of these measurements are given in Table 2.

TABLE 1

| Example no. | Weather-resistant layer (thickness) | Connecting layer (thickness) | Functional layer (thickness) |
|---|---|---|---|
| Ex. 1 | 71 parts of polypropylene, 5 parts of polyolefin elastomer, 12 parts of titanium dioxide, 10 parts of talcum powder, ultraviolet absorbent is 1.0 part of Chimassorb 2020, primary antioxidant is 0.25 part of AO-80, the assistant antioxidant is 0.75 part of 412S (240 um) | 50 parts of polypropylene, 49 parts of polyolefin elastomer, ultraviolet absorbent is 1.0 part of Chimassorb 2020, primary antioxidant is 0.25 part of AO-80, the assistant antioxidant is 0.75 part of 412S (30 um) | 50 parts of polyethylene, 16 parts of polypropylene, 20 parts of ethyl copolymer, 12 parts of titanium dioxide, the ultraviolet absorbent is 1.0 part of Chimassorb 2020, primary antioxidant is 0.25 part of AO-80, the assistant antioxidant is 0.75 part of 412S (30 um) |
| Comp Ex. 1 | 71 parts of polypropylene, 5 parts of polyolefin elastomer, 12 parts of titanium dioxide, 10 parts of talcum powder, ultraviolet absorbent is 1.0 part of Chimassorb 2020, antioxidant is 1 part of Irganox ® 1010 (240 um) | 50 parts of polypropylene, 49 parts of polyolefin elastomer, ultraviolet absorbent is 1.0 part of Chimassorb 2020, antioxidant is 1 part of Irganox ® 1010 (30 um) | 50 parts of polyethylene, 16 parts of polypropylene, 20 parts of ethyl copolymer, 12 parts of titanium dioxide, the ultraviolet absorbent is 1.0 part of Chimassorb 2020, antioxidant is 1 part of Irganox ® 1010 (30 um) |
| Ex. 2 | Inner sub-layer: 71 parts of polypropylene, 5 parts of polyolefin elastomer, 12 parts of titanium dioxide, 10 parts of talcum powder, ultraviolet absorbent is 1.0 part of Chimassorb 2020, primary antioxidant is 0.25 part of AO-80, the assistant antioxidant is 0.75 part of 412S (200 um); | 50 parts of polypropylene, 49 parts of polyolefin elastomer, ultraviolet absorbent is 1.0 part of Chimassorb 2020, primary antioxidant is 0.25 part of AO-80, the | 50 parts of polyethylene, 16 parts of polypropylene, 20 parts of ethyl copolymer, 12 parts of titanium dioxide, the ultraviolet |

TABLE 1-continued

| Example no. | Weather-resistant layer (thickness) | Connecting layer (thickness) | Functional layer (thickness) |
|---|---|---|---|
| | Outer sub-layer: 71 parts of polypropylene, 5 parts of polyolefin elastomer, 17 parts of titanium dioxide, 5 parts of talcum powder, ultraviolet absorbent is 2.0 parts of Chimassorb 2020, antioxidant is primary antioxidant is 0.5 part of AO-80, the assistant antioxidant is 1.5 part of 412S (40 um) | assistant antioxidant is 0.75 part of 412S (30 um) | absorbent is 1.0 part of Chimassorb 2020, primary antioxidant is 0.25 part of AO-80, the assistant antioxidant is 0.75 part of 412S (30 um) |
| Comp Ex. 2 | Commercially available polyolefin backsheet | | |

TABLE 2

| Test | Method/ standard | Ex. 1 | Comp Ex. 1 | Ex. 2 | Comp. Ex. 2 |
|---|---|---|---|---|---|
| Elongation retention (%) after damp-heat aging 2000 h | MD 85° C., TD 85% RH | 73 71 | 67 65 | 69 76 | 39 76 |
| Thermal stability test | 200° C., 5 h | Not cracked | Cracked | Not cracked | Cracked |
| Elongation retention (%) after thermal aging | MD 150° C., TD 300 h | 25 29 | 20 21 | 36 37 | 10 13 |

The invention claimed is:

1. A photovoltaic module backsheet comprising:
    a functional layer located at a first face of the backsheet and adapted to being positioned adjacent photovoltaic cells of a photovoltaic module;
    a weather-resistant layer located at a second face of the backsheet opposite the first face and adapted to being exposed to air; and
    a connecting layer which connects the functional layer to the weather-resistant layer, wherein
    (i) the functional layer comprises a ternary blend which comprises, based on the weight of the functional layer:
        (ia) 5 to 30 wt. % of polypropylene,
        (ib) at least 50 wt. % of polyethylene, and
        (ic) 20 to 40 wt. % of an ethylene methacrylate copolymer; and wherein
    (ii) the weather-resistant layer comprises, based on the weight of the weather-resistant layer:
        (iia) at least 50 to at most 95 wt. % of polypropylene;
        (iib) a UV stabilizer;
        (iic) a primary antioxidant which is selected from the group consisting of phenolic antioxidants and aromatic amine antioxidants; and
        (iid) a secondary antioxidant which is selected from the group consisting of trivalent phosphorus containing antioxidants and thioether containing antioxidants, wherein
        the primary and secondary antioxidants are each present in a wt. % amount such that a ratio of the wt. % of the primary antioxidant to the wt. % of the secondary antioxidant is from 0.1 to 1.0, and wherein
    (iii) the connecting layer comprises:
        (iiia) at least 50 wt. % to at most 95 wt. % of polyethylene, and
        (iiib) a maleic anhydride grafted polyolefin, wherein the backsheet is free of fluorinated polymers.

2. The photovoltaic module backsheet according to claim 1, wherein the photovoltaic module backsheet consists of the functional layer, the connecting layer and the weather-resistant layer.

3. The photovoltaic module backsheet according to claim 1, wherein the weather-resistant layer comprises a polypropylene-polyethylene copolymer.

4. The photovoltaic module backsheet according to claim 3, wherein the weather-resistant layer comprises from 75 to 90 wt. % of the polypropylene-polyethylene copolymer.

5. The photovoltaic module backsheet according to claim 1, wherein the weather-resistant layer comprises an outer sub-layer comprising an inorganic filler and an inner sub-layer comprising an inorganic filler, wherein the outer sub-layer comprises a lower wt. % of inorganic filler than the inner sub-layer.

6. The photovoltaic module backsheet according to claim 5, wherein the outer sub-layer and inner sub-layer each comprise titanium dioxide, and the outer sub-layer comprises a higher wt. % titanium dioxide than the inner sub-layer.

7. The photovoltaic module backsheet according to claim 1, wherein the primary antioxidant is a phenolic antioxidant which is selected from the group consisting of benzenepropanoic acid, 3,5-bis(1,1-dimethylethyl)-4-hydroxy-octadecyl ester; 2,5,7,8-Tetra-methyl-2-(4',8',12'-tri-methyl-tridecyl)-chroman-6-ol; N,N'-Hexamethylene bis (3,5-di-t-butyl-4-hydroxyhydrocinnamide); ethylenebis (oxyethylene) bis (3-t-butyl-4-hydroxy-5-methylhydrocinnamate); hexamethylenebis (3,5-di-t-butyl-4-hydroxycinnamate); phenol, 4,4'4'''-[(2,4,6-trimethyl-1,3,5-benzenetriyl)-tris-(methylene)]-tris-2,6-bis(1,1-dimethylethyl)-; bis-[3,3-bis-(4'-hydroxy-3'-t-butylphenyl butanoic acid]-glycol ester; tris(3,5-di-t-butyl-4-hydroxy benzyl) isocyanurate; 3,9-bis(2-(3-(3-tert-butyl-4-hydroxy-5-methylphenyl) propionyloxy-1,1-dimethylethyl)-2,4,8,10-tetraoxaspiro [5.5]undecane; 1,3,5-Tris (4-t-butyl-3-hydroxy-2,6-dimethylbenzyl)-1,3,5-triazine-2,4,6-(1H,3H,5H)-trione; and tetrakis [methylene (3,5-di-t-butyl-4-hydroxyhydrocinnamate)] methane 3-(3,5-di-t-butyl-4-hydroxy-phenyl) propion acid ester with 1,3,5-tris (2-hydroxy-ethyl)-iso-cyanurate.

8. The photovoltaic module backsheet according to claim 1, wherein the secondary antioxidant is a thioether antioxidant which is selected from the group consisting of dilauryl thiodipropionate, distearyl thiodipropionate, dimyristyl thiodipropionate, pentaerythrityl tetrakis (β-laurylthiopropionate) and 3,3-thiodipropanoic acid.

9. The photovoltaic module backsheet according to claim 1, wherein the functional layer has a thickness of from 10 to 50 μm.

10. The photovoltaic module backsheet according to claim 1, wherein the connecting layer has a thickness of from 10 to 50 μm.

11. The photovoltaic module backsheet according to claim 1, wherein the weather-resistant layer has a thickness of from 100 to 400 μm.

12. The photovoltaic module backsheet according to claim 1, wherein the maleic anhydride grafted polyolefin is selected from the group consisting of maleic anhydride grafted polyethylene, maleic anhydride grafted polypropylene, an ethylene-acrylic acid copolymer, an ethylene acrylic acid terpolymer and an ethylene-acrylic ester-maleic anhydride terpolymer.

13. The photovoltaic module backsheet according to claim 12, wherein the maleic anhydride grafted polyolefin is ethylene/butyl acrylate/maleic anhydride grafted polypropylene.

14. The photovoltaic module backsheet according to claim 1, wherein the connecting layer comprises a blend of a polyolefin with a polyethylene-polypropylene block copolymer.

15. The photovoltaic module backsheet according to claim 1, wherein the connecting layer further comprises up to 30 wt. % of a polyolefin elastomer.

16. A photovoltaic module comprising the solar module backsheet as defined in claim 1.

17. A process for producing the photovoltaic module backsheet as defined in claim 1 comprising:
   i) feeding a functional layer composition; a connecting layer composition; and a weather-resistant layer composition independently to a multi-layer film coextrusion apparatus; and
   ii) melting and coextruding the compositions, in the multi-layer film coextrusion apparatus, into a photovoltaic module backsheet in the order of the functional layer, the connecting layer, and the weather-resistant layer.

18. A process for producing the photovoltaic module backsheet as defined in claim 1, wherein the weather-resistant layer comprises inner and outer weather-resistant sublayers, and wherein the process comprises:
   i) feeding a functional layer composition; a connecting layer composition; an inner weather-resistant sublayer composition and an outer weather-resistant sublayer composition independently to a multi-layer film coextrusion apparatus; and
   ii) melting and coextruding the compositions, in the multi-layer film coextrusion apparatus, into a photovoltaic module backsheet in the order of the functional layer, the connecting layer, the inner weather-resistant sublayer and the outer weather-resistant sublayer.

* * * * *